(12) United States Patent
Eriguchi et al.

(10) Patent No.: US 10,641,708 B2
(45) Date of Patent: May 5, 2020

(54) METHOD OF EVALUATING SEMICONDUCTOR SUBSTRATE AND METHOD OF MANUFACTURING SEMICONDUCTOR SUBSTRATE

(71) Applicant: SUMCO CORPORATION, Tokyo (JP)

(72) Inventors: Kazutaka Eriguchi, Saga (JP); Tsuyoshi Kubota, Saga (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/557,221

(22) PCT Filed: Dec. 16, 2015

(86) PCT No.: PCT/JP2015/085234
§ 371 (c)(1),
(2) Date: Sep. 11, 2017

(87) PCT Pub. No.: WO2016/147510
PCT Pub. Date: Sep. 22, 2016

(65) Prior Publication Data
US 2018/0038797 A1    Feb. 8, 2018

(30) Foreign Application Priority Data
Mar. 18, 2015 (JP) ................. 2015-055160

(51) Int. Cl.
*G01N 21/64* (2006.01)
*G01N 21/95* (2006.01)
(Continued)

(52) U.S. Cl.
CPC ..... *G01N 21/6489* (2013.01); *G01N 21/9501* (2013.01); *H01L 21/0223* (2013.01);
(Continued)

(58) Field of Classification Search
CPC ........................................... G01N 21/64
See application file for complete search history.

(56) References Cited

U.S. PATENT DOCUMENTS

| | | |
|---|---|---|
| 4,952,063 A | 8/1990 | Opsal et al. |
| 7,727,783 B2 | 6/2010 | Kubota |

(Continued)

FOREIGN PATENT DOCUMENTS

| | | |
|---|---|---|
| CN | 1479944 A | 3/2004 |
| CN | 1496478 A | 5/2004 |

(Continued)

OTHER PUBLICATIONS

U.S. Appl. No. 15/788,142 to Noritomo Mitsugi et al., which was filed on Oct. 19, 2017.

(Continued)

*Primary Examiner* — Marvin Payen
(74) *Attorney, Agent, or Firm* — Greenblum & Bernstein, P.L.C.

(57) ABSTRACT

Provided is a method of evaluating a semiconductor substrate, which evaluates quality of the semiconductor substrate by a photoluminescence measurement, wherein the evaluation by the photoluminescence measurement includes, after subjecting a surface of an evaluation-target semiconductor substrate to a pretreatment, irradiating the surface with excitation light, and then detecting emission obtained from the surface having been irradiated with the excitation light, and the pretreatment includes subjecting the surface of the evaluation-target semiconductor substrate to be irradiated with the excitation light to an oxide film formation treatment and charging the surface of the formed oxide film by corona discharge.

10 Claims, 2 Drawing Sheets

(51) Int. Cl.
    *H01L 21/02*     (2006.01)
    *H01L 21/66*     (2006.01)
    *H01T 19/02*     (2006.01)

(52) U.S. Cl.
    CPC ........ *H01L 21/02299* (2013.01); *H01L 22/12* (2013.01); *H01T 19/02* (2013.01)

(56) References Cited

U.S. PATENT DOCUMENTS

| | | | |
|---|---|---|---|
| 8,411,263 | B2 | 4/2013 | Uchino et al. |
| 9,842,779 | B2 | 12/2017 | Matsumoto et al. |
| 2015/0318222 | A1* | 11/2015 | Matsumoto ............. H01L 22/12 702/81 |
| 2016/0079129 | A1 | 3/2016 | Fukushima et al. |

FOREIGN PATENT DOCUMENTS

| | | |
|---|---|---|
| CN | 1877805 A | 12/2006 |
| CN | 101303992 A | 11/2008 |
| DE | 4412297 | 10/1995 |
| JP | 7-240450 A | 9/1995 |
| JP | 10502490 A * | 3/1998 |
| JP | H10-502490 A | 3/1998 |
| JP | 10270516 A * | 10/1998 |
| JP | H10-270516 A | 10/1998 |
| JP | 2011-54691 A | 3/2011 |
| JP | 2011-82312 A | 4/2011 |
| JP | 2014-143325 A | 8/2014 |
| TW | 273042 | 3/1996 |
| TW | 201447273 A | 12/2014 |
| WO | 02/29883 A1 | 4/2002 |
| WO | 02/065108 A2 | 8/2002 |
| WO | 02/065108 A3 | 8/2002 |

OTHER PUBLICATIONS

International Search Report issued in WIPO Patent Application No. PCT/JP2015/085234, dated Mar. 8, 2016.
First Office Action issued in Taiwan Family Member Patent Appl. No. 104142425, dated Feb. 17, 2017 , along with an English translation thereof.
Second Office Action issued in Taiwan Family Member Patent Appl. No. 104142425, dated Jun. 14, 2017 , along with an English translation thereof.
Office Action dated Jan. 4, 2019 issued in the corresponding German patent application No. 112015006323.4 with partial English translation.
Notification of Reason for Refusal dated Jan. 21, 2019 issued in the corresponding Korean patent application No. 10-2017-7029722 with English machine translation.
Decision of Refusal dated Feb. 5, 2019 issued in the corresponding Japanese patent application No. 2015-055160 with English machine translation.
Office Action issued in the corresponding Japanese patent application No. 2015-055160 dated Sep. 11, 2018.
Office Action dated Dec. 4, 2018 issued in corresponding Japanese patent application No. 2015-055160 w/ English Machine Translation.
Notice of Final Rejection issued in corresponding KR App. No. 10-2017-7029722 dated Sep. 27, 2019 w/ English translation.
OA dated Nov. 29, 2019 issued in corresponding CN Pat. App. No. 201580077185.9 with English Machine Translation.
OA issued in corresponding Korean Pat. App. No. 10-2017-7029722 dated Jan. 3, 2020, with English Machine Translation.

* cited by examiner

METHOD OF EVALUATING SEMICONDUCTOR SUBSTRATE AND METHOD OF MANUFACTURING SEMICONDUCTOR SUBSTRATE

CROSS-REFERENCE TO RELATED APPLICATIONS

This application claims the benefit of priority to Japanese Patent Application No. 2015-55160 filed on Mar. 18, 2015, which is expressly incorporated herein by reference in its entirety.

TECHNICAL FIELD

The present invention relates to a method of evaluating a semiconductor substrate, and to a method of manufacturing a semiconductor substrate.

BACKGROUND ART

There is proposed, as an evaluation method of a semiconductor substrate, a method that utilizes a photoluminescence (hereinafter, also referred to as "PL") measurement (hereinafter, referred to as a "PL method"), for example, in Japanese Unexamined Patent Publication (KOKAI) No. 2011-54691, which is expressly incorporated herein by reference in its entirety.

SUMMARY OF THE INVENTION

With the PL method, it is possible to obtain information about various crystal defects such as impurity contamination, the presence of a defect and the like, by irradiating a surface of a semiconductor substrate with excitation light and detecting light emission that is generated when an electron-hole pair (carrier) excited by the excitation light recombines.

With respect to the PL method, in Japanese Unexamined Patent Publication (KOKAI) No. 2011-54691, hydrofluoric acid cleaning and pure water rinsing after the cleaning (hereinafter, referred to as an "HF treatment") are proposed as a pretreatment of the PL measurement for a silicon wafer. The HF treatment described in Japanese Unexamined Patent Publication (KOKAI) No. 2011-54691 is a means for enhancing sensitivity of evaluation by the PL measurement by bringing the surface of a silicon wafer into a hydrogen termination state (see Japanese Unexamined Patent Publication (KOKAI) No. 2011-54691, paragraph 0008). However, in recent years, a semiconductor substrate has been required to have higher quality along with higher performance of devices and the like. In order to respond to the requirement for higher quality, it is required to further enhance the sensitivity for quality evaluation of a semiconductor substrate. In addition, for the purpose, it is desirable to raise an emission intensity (PL intensity) obtained by the PL measurement. That is because it becomes possible to detect impurity contamination or the presence of a defect even when existing at a low level by raising the PL intensity, namely, it becomes possible to realize higher sensitivity.

Furthermore, in order to enhance the reliability of quality evaluation of a semiconductor substrate, temporary change in evaluation result is desirably small (variation in evaluation result along with a lapse of time is small and accuracy of the evaluation is high). However, in the HF treatment described in Japanese Unexamined Patent Publication (KOKAI) No. 2011-54691, it is expected that the surface of the silicon wafer in a hydrogen termination state changes with a lapse of time by the influence from an ambient atmosphere, and thus it is considered that measurement results vary depending on elapsed time from the BF treatment.

An aspect of the present invention provides for an evaluation method of a semiconductor substrate by the PL measurement that makes the evaluation with high sensitivity and high accuracy possible.

The present inventors have made intensive studies in order to achieve the above-described purpose, and as the result, they have newly found that, by performing formation of an oxide film and a corona discharge treatment on the formed oxide film as a pretreatment of the PL measurement, the PL intensity can rise and variation in measurement results along with a lapse of time can be reduced, in comparison with a case of performing the pretreatment by the HF treatment as described in Japanese Unexamined Patent Publication (KOKAI) No. 2011-54691, to thereby devise the present invention.

An aspect of the present invention relates to a method of evaluating a semiconductor substrate,
which evaluates quality of the semiconductor substrate by a photoluminescence measurement, wherein
the evaluation by the photoluminescence measurement includes, after subjecting a surface of an evaluation-target semiconductor substrate to a pretreatment, irradiating the surface with excitation light, and then detecting emission obtained from the surface having been irradiated with the excitation light; and
the pretreatment includes subjecting the surface of the evaluation-target semiconductor substrate to be irradiated with the excitation light to an oxide film formation treatment and charging the surface of the formed oxide film by corona discharge.

In an embodiment, the semiconductor substrate is a p-type semiconductor substrate.

In an embodiment, the semiconductor substrate is an n-type semiconductor substrate.

In an embodiment, the surface of the oxide film is positively charged by the corona discharge.

In an embodiment, the quality to be evaluated is metal contamination of the semiconductor substrate.

In an embodiment, the oxide film formation treatment is performed by dry oxidization.

In an embodiment, the oxide film formation treatment is performed by thermal oxidization.

In an embodiment, the semiconductor substrate is a silicon substrate.

A further aspect of the present invention relates to a method of manufacturing a semiconductor substrate, including:
preparing a semiconductor substrate lot including a plurality of semiconductor substrates;
extracting at least one semiconductor substrate from the lot;
evaluating the extracted semiconductor substrate; and
shipping, as a product substrate, at least one semiconductor substrate included in the same lot as the lot in which the semiconductor substrate having been determined to be a non-defective product by the evaluation is included,
wherein the evaluation of the extracted semiconductor substrate is performed by the above method of evaluating a semiconductor substrate.

According to an aspect of the present invention, it is possible to evaluate, with high sensitivity and high accuracy, quality of a semiconductor substrate such as metal contamination, through evaluation by the PL measurement. Furthermore, this also makes it possible to stably supply a semiconductor substrate with high quality.

MODES FOR CARRYING OUT THE INVENTION

[Evaluation Method of Semiconductor Substrate]

Figure 1:
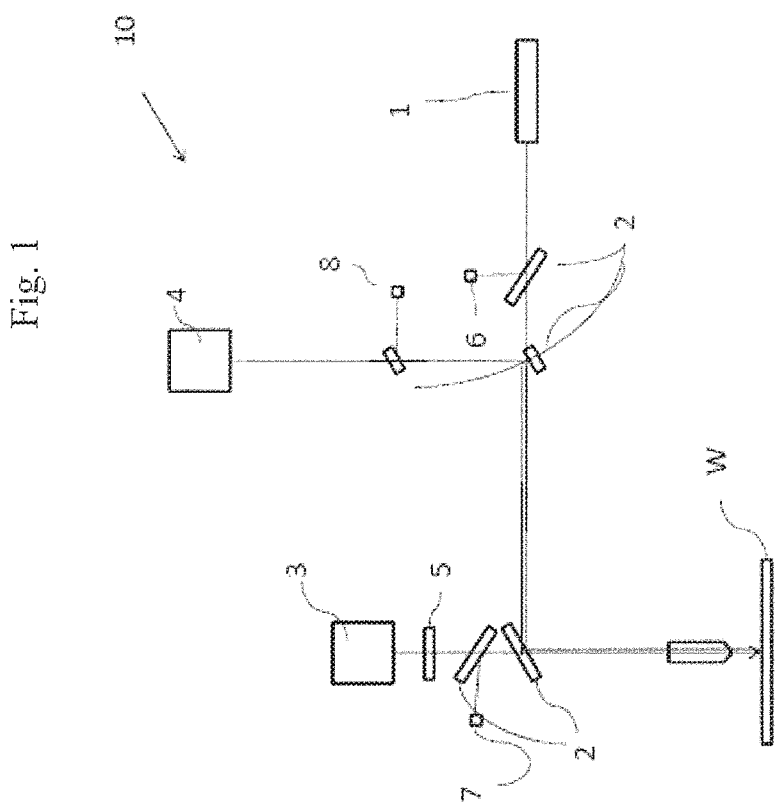
FIG. 1 is a schematic view of a measurement apparatus based on a strong excitation microscopic photoluminescence method.

An aspect of the present invention relates to an evaluation method of a semiconductor substrate, which evaluates quality of a semiconductor substrate by a photoluminescence measurement. In the evaluation method of a semiconductor substrate of the present invention, the evaluation by the photoluminescence measurement includes, after subjecting a surface of an evaluation-target semiconductor substrate to a pretreatment, irradiating the surface with excitation light, and then detecting light emission obtained from the surface having been irradiated with this excitation light; and the pretreatment includes subjecting the surface of the evaluation-target semiconductor substrate to be irradiated with the excitation light to an oxide-film formation treatment and charging the surface of the formed oxide film by corona discharge.

Hereinafter, the evaluation method of a semiconductor substrate according to an aspect of the present invention (hereinafter, also described simply as the "evaluation method") will be described in more detail.

<Evaluation-Target Semiconductor Substrate>

The evaluation-target semiconductor substrate is, for example, a silicon substrate (silicon wafer). However, the evaluation-target substrate is not limited to a silicon substrate, and the evaluation method according to an aspect of the present invention is also applicable to, for example, a compound semiconductor substrate.

A conductivity type of the semiconductor substrate may be a p-type or an n-type. In both cases where the evaluation-target semiconductor substrate is the semiconductor substrate of either conductivity type, it is possible to evaluate, with high sensitivity and high accuracy, the quality thereof by the evaluation method according to an aspect of the present invention. Applicability irrespective of the conductivity type of the semiconductor substrate is one of advantages of the evaluation method according to an aspect of the present invention. In addition, as described below, the charge by corona discharge may be positive or negative. In the evaluation method according to an aspect of the present invention, it is unnecessary to change conditions of corona discharge (whether positive charges are to be caused or negative charges are to be caused) according to the conductivity type of the evaluation-target semiconductor substrate, and thus the evaluation can be preformed without changing setting of a corona discharge apparatus for every measurement. Furthermore, the pretreatment can be collectively performed even in a case of a sample group in which p-type and n-type semiconductor substrates coexist. Above-described points are also advantages of the evaluation method according to an aspect of the present invention. The size of the evaluation-target semiconductor substrate can be, for example, 200 mm, 300 mm, or 450 mm in diameter, but the size may be larger or smaller than these, and is not particularly limited. The substrate resistance value is also not particularly limited.

<Pretreatment Prior to PL Measurement>

As will be described below in detail, in evaluation by the PL measurement, either one of surfaces of the evaluation-target semiconductor substrate (hereinafter, also referred to as an "irradiation-target surface") is irradiated with excitation light, and light emission obtained from the surface having been irradiated with this excitation light is detected. In the evaluation method according to an aspect of the present invention, the irradiation-target surface is subjected to an oxide film formation treatment as a pretreatment prior to the irradiation with excitation light, and then, the surface of the formed oxide film is charged by corona discharge. The present inventors presume that the capability to suppress surface recombination by the pretreatment contributes to the increase in the PL intensity, and that a small change of the surface after the pretreatment with a lapse of time contributes to reducing variation in the evaluation results along with a lapse of time.

Hereinafter, the oxide film formation and corona discharge will be described in more detail.

(Oxide Film Formation)

In oxide film formation, an oxide film can be formed at least on the irradiation-target surface of the evaluation-target semiconductor substrate, and can be formed on a portion other than the irradiation-target surface. The oxide film formation can be performed by either dry oxidization or wet oxidization. From the viewpoint of further improvement of measurement accuracy, homogeneity and in-plane thickness uniformity of an oxide film to be formed are preferably high. From the point, dry oxidization is more advantageous than wet oxidization.

The dry oxidization can be performed by various methods capable of forming an oxide film without using a treatment liquid, such as plasma treatment, thermal oxidization and the like, and thermal oxidization is preferable. The thermal oxidization can be performed by arrangement of the semiconductor substrate in a heated oxidizing atmosphere. Here, the oxidizing atmosphere is an atmosphere containing at least oxygen, and can be an atmosphere containing oxygen in, for example, 10 volume % to 100 volume %. An atmospheric temperature (heating temperature) of the oxidizing atmosphere can be set to be, for example, 700 to 1300° C., and heating time can be set to be, for example, 1 to 1.000 minutes, but it is sufficient that an oxide film can be formed, and the heating temperature and the heating time in the above range are not limiting.

A thickness of an oxide film formed by the oxide film formation treatment can be set to be in a range of, for example, 2 nm to 1 μm, but is not particularly limited. A natural oxide film may exist in some cases on an irradiation-target surface before the oxide film formation. The oxide film formation treatment may be given after removal of such natural oxide film, or the oxide film formation treatment may be given without removal of the film. The removal of the natural oxide film can be performed by, for example, an HF treatment as described in Japanese Unexamined Patent Publication (KOKAI) No. 2011-54691. However, the HF treatment is a wet treatment, and thus, tends to easily generate variation in treatment in the plane. In consideration of the point, it is more preferable to give the oxide film formation treatment without removing the natural oxide film.

(Corona Discharge)

In the evaluation method according to an aspect of the present invention, the surface of the oxide film having been formed by the oxide film formation treatment is charged by corona discharge. The corona discharge can be performed by a conventionally known corona discharge treatment method such as a method of using a commercially available corona treatment apparatus. The present inventors presume that suppression of surface recombination by charging the oxide film surface by the corona discharge contributes to the increase in the PL intensity.

The oxide film surface may be positively or negatively charged by corona discharge. The oxide film surface can be positively charged when positive ions are generated by corona discharge, or the oxide film surface can be negatively charged when negative ions are generated. From the viewpoint of farther increasing the PL intensity and from the viewpoint of further reducing variation in measurement results along with a lapse of time, preferably, the oxide film surface is positively charged.

The following description is presumed by the present inventors and does not limit the present invention, but the present inventors presume that the capability to bend an energy band of a semiconductor substrate surface due to charging of the oxide film surface by corona discharge contributes to suppressing the surface recombination to thereby increase the PL intensity and contributes to further reducing variation in measurement results along with a lapse of time. In detail, the present inventors presume that the bending of the band on the surface in a negative direction by positive charging of the surface and thus filling of the energy level at the surface with electrons act so as to suppress recombination. Furthermore, the present inventors presume that the bending of the band on the surface in a positive direction by negative charging and thus the inhibition of approach of electrons to the surface act so as to suppress recombination. According to the above surface band model, it is presumed that the suppression of the surface recombination by filling of the energy level at the surface with electrons (positive charging) can suppress more effectively the surface recombination, in comparison with the inhibition of approach of electrons to the surface by bending of the band on the surface (in comparison with negative charging). However, as mentioned above, the above description is based on presumption by the present inventors, and the charge of the oxide film surface in the present invention may be either positive or negative, as mentioned above.

<PL Measurement>

In the evaluation method according to an aspect of the present invention, the PL measurement is performed after the oxide film formation treatment and the corona discharge as described above are performed. The PL measurement can be performed by a known method, and is not particularly limited. From the viewpoint of ease of operation, the measurement is preferably performed by room temperature photoluminescence measurement (room temperature PL measurement) for which temperature control is unnecessary. When a silicon substrate is taken as an example, in a room temperature PL method, electron-hole pairs (namely, carriers) generated near the surface by excitation light that is made to enter from the surface of a sample substrate and has energy larger than the band gap of silicon emit light while the electron-hole pairs are diffused inside the substrate, and then disappear. The emission is referred to as a band edge emission, and exhibits an emission intensity of about 1.15 µm in wavelength at room temperature (for example, 20 to 30° C.). In photoluminescence measurement, usually, visual light is used as excitation light, and thus measurement of light intensity having a wavelength of equal to or longer than 950 nm makes it possible to separate the PL intensity from the excitation light. Therefore, measurement with high sensitivity becomes possible. From the point, measurement of band edge emission intensity as the PL intensity is preferable. Here, difference in level of the PL intensity is generated depending on the presence or existing amount of impurities or defects, and thus, for example, the presence/absence or the degree of impurity contamination, existence/nonexistence or existing amount of defect can be evaluated by the PL intensity measured at a part of an irradiation-target surface of the evaluation-target semiconductor substrate, an average value of PL intensities measured at various portions within the surface, or the like. Furthermore, in-plane distribution of impurities or defects can also be evaluated by the difference in level of PL intensity at various portions within the surface.

Examples of apparatuses that can be used for measurement of the PL intensity by room temperature PL measurement include a measurement apparatus based on a strong excitation microscopic photoluminescence method. The strong excitation microscopic photoluminescence method is a method in which carriers in silicon are excited by a visible light laser and furthermore, emission (band edge emission) intensity generated when the excited carriers directly recombine between the band gaps is detected. FIG. 1 is a schematic diagram of a measurement apparatus based on the strong excitation microscopic photoluminescence method. In FIG. 1, 10 denotes a measurement apparatus, 1 denotes a laser light source, 2 denotes a half mirror, 3 denotes a photoluminescence detector, 4 denotes a detector for autofocus, 5 denotes a band pass filter, 6 denotes an input meter, 7 denotes an output meter, 8 denotes a surface scattered light detector, and W denotes a measurement-target sample (semiconductor substrate). The measurement-target sample W is placed on an X-Y stage (not shown), and exciting laser light is scanned in the X direction and the Y direction of the substrate surface, with the operation of the X-Y stage. Accordingly, PL intensity information of the evaluation-target semiconductor substrate can be obtained. The PL intensity information may be obtained on the entire irradiation-target surface of the evaluation-target semiconductor substrate, or may be obtained at a part. Furthermore, when PL in-plane distribution information is to be obtained as the PL intensity information, the in-plane distribution information to be obtained may be a line profile of the PL intensity, or may be a mapping profile. In order to perform quality evaluation over the entire surface region, it is preferable to obtain a mapping profile. In the mapping profile, by allotting high intensity to low intensity of the PL to, for example, brightness of black-white (degree of light and darkness), it is possible to evaluate the level of the PL intensity depending on light and darkness of the mapping image.

<Evaluation-Target Quality>

The evaluation-target quality in the evaluation method according to an aspect of the present invention can be the presence/absence, degree, and existing amount of various crystal defects causing the change in the PL intensity when the defects are contained in the semiconductor substrate. For example, the presence/absence or existing amount of various crystal defects, such as the presence/absence or degree of contamination by impurities such as a metal or dopant; the presence/absence or existing amount of structural defects such as a point defect, line defect or plane defect; or the presence/absence or existing amount of micro defects such as an oxygen precipitate or micro hollow, can be set as an evaluation target. These crystal defects can exist on a surface, in a surface layer portion or in a bulk of the evaluation-target semiconductor substrate. Here, the surface layer portion means a region of a depth of approximately 1 μm from the surface of the semiconductor substrate, and the bulk means a further deeper region having a depth exceeding 1 μm from the surface of the semiconductor substrate, or means the entire semiconductor substrate. With the evaluation method according to an aspect of the present invention, it is possible to evaluate the presence/absence, degree or existing amount of various crystal defects of the surface, the surface layer portion or the bulk.

[Method of Manufacturing Semiconductor Substrate]

A farther aspect of the present invention relates to a method of manufacturing a semiconductor substrate, including:

preparing a semiconductor substrate lot including a plurality of semiconductor substrates;

extracting at least one semiconductor substrate from the lot;

evaluating the extracted semiconductor substrate; and shipping, as a product substrate, at least one semiconductor substrate included in the same lot as the lot in which the semiconductor substrate having been determined to be a non-detective product by the evaluation is included, wherein the evaluation of the extracted semiconductor substrate is performed by the evaluation method of the semiconductor substrate according to an aspect of the present invention.

With the evaluation method of the semiconductor substrate according to an aspect of the present invention, the quality of the semiconductor substrate can be evaluated with high sensitivity and high accuracy. Consequently, it is possible to provide, with high reliability, the product substrate capable of producing devices with high quality, by shipping, as a product substrate, the semiconductor substrate within the same lot as the lot of the semiconductor substrate having been determined as a result of quality evaluation by the evaluation method that, for example, the presence/absence or degree of impurity contamination, or the presence/absence or existing amount of defects is at a level allowed as a non-detective product usable for manufacturing devices with high quality. The standard for determination as a non-defective product can be set in consideration of properties required for a substrate according to applications or the like of the semiconductor substrate. Furthermore, the number of substrates contained in one lot and the number of substrates to be extracted can be appropriately set.

EXAMPLES

Hereinafter, the present invention will be further described by Examples. However, the present invention is not limited to embodiments shown in Examples.

In the following PL measurement, a band edge photoluminescence emission intensity map measurement was performed at a pitch of 500 μm by the use of a PL measurement apparatus SiPHER manufactured by Nanometrics as an apparatus shown in FIG. 1 and by the utilization of a light source of 532 nm in wavelength as a measurement laser.

[Confirmation of PL Intensity and Temporal Change by Difference of Pretreatment]

(1) Preparation of Evaluation-Target Semiconductor Substrate

Eight silicon wafers of a p-type or an n-type having a diameter of 200 mm (resistance: 10 Ω·cm) were prepared for respective conductivity types.

(2) Preparation of Samples for PL Measurement

Hereinafter, eight p-type silicon wafers are referred to as samples p-1, p-2, p-3, p-4, p-5, p-6, p-7 and p-8. In the similar way, eight n-type silicon wafers are also denoted as samples n-1 to n-8.

As to the samples p-1 and n-1, the PL measurement was performed without a pretreatment. As to other samples, the PL measurement was performed after giving respective pretreatments shown in Table 1.

The "oxide film formation" shown in Table 1 denotes a thermal oxidization treatment performed in a thermal oxidization furnace (oxygen 100% atmosphere, atmospheric temperature in the furnace of 1100° C., treatment time of 10 minutes, thickness of a formed oxide film was about 40 nm).

"Corona (+)" shown in Table 1 means a corona discharge treatment that positively charges the surface to be treated (positive corona discharge treatment).

"Corona, (−)" shown in Table 1 means a, corona discharge treatment that negatively charges the surface to be treated (negative corona discharge treatment).

"HF" shown in Table 1 means a treatment in which a sample is immersed in a 5 mass % hydrofluoric acid aqueous solution for 10 minutes, which is then rinsed with pure water for 10 minutes (HF treatment).

In addition, in Table 1, "→" means that the treatment described on the left side of → was given and then the treatment described on the right side was given.

(3) PL Measurement

For the surface of respective samples (the pretreated surface for the samples having been subjected to a pretreatment), the above map measurement was repeated five times, and an in-plane average value for each time of measurement was defined as the PL intensity of the relevant time. The PL intensity for each time of measurement thus obtained, and an average value of PL intensities for five times and a coefficient of variation CV ((standard deviation/average value)× 100) were obtained. Results are shown in Table 1.

TABLE 1

| Sample | Pretreatment | PL intensity (mV) | | | | | Average value | CV[1] |
| --- | --- | --- | --- | --- | --- | --- | --- | --- |
| | | 1 | 2 | 3 | 4 | 5 | | |
| p-1 | None | 7.0 | 7.1 | 7.1 | 7.1 | 7.0 | 7.1 | 0.46 |
| p-2 | HF | 27.3 | 27.1 | 26.9 | 26.7 | 26.5 | 26.9 | 1.14 |
| p-3 | Corona (+) | 7.1 | 7.1 | 7.1 | 7.0 | 7.0 | 7.1 | 0.75 |
| p-4 | Corona (−) | 8.2 | 8.1 | 8.1 | 8.0 | 8.0 | 8.1 | 1.20 |
| p-5 | Oxide film formation | 40.4 | 40.4 | 40.4 | 40.5 | 40.4 | 40.4 | 0.11 |
| p-6 | Oxide film formation→HF | 27.1 | 27.0 | 26.9 | 26.7 | 26.6 | 26.9 | 0.67 |
| p-7 | Oxide film formation→Corona (+) | 41.4 | 41.4 | 41.4 | 41.4 | 41.4 | 41.4 | 0.04 |
| p-8 | Oxide film formation→Corona (−) | 40.5 | 40.5 | 40.5 | 40.4 | 40.4 | 40.4 | 0.06 |
| n-1 | None | 8.5 | 8.5 | 8.5 | 8.5 | 8.5 | 8.5 | 0.12 |

TABLE 1-continued

| | | PL intensity (mV) | | | | | | |
|---|---|---|---|---|---|---|---|---|
| Sample | Pretreatment | 1 | 2 | 3 | 4 | 5 | Average value | CV[1] |
| n-2 | HF | 26.2 | 25.8 | 25.6 | 25.4 | 25.3 | 25.7 | 1.33 |
| n-3 | Corona (+) | 8.6 | 8.6 | 8.6 | 8.6 | 8.6 | 8.6 | 0.12 |
| n-4 | Corona (−) | 9.7 | 9.7 | 9.6 | 9.6 | 9.6 | 9.6 | 0.32 |
| n-5 | Oxide film | 40.7 | 40.8 | 40.8 | 40.8 | 40.8 | 40.8 | 0.03 |
| n-6 | Oxide film formation→HF | 26.9 | 26.8 | 26.6 | 26.3 | 26.2 | 26.6 | 1.11 |
| n-7 | Oxide film formation→Corona (+) | 42.0 | 42.0 | 42.0 | 42.0 | 42.0 | 42.0 | 0.02 |
| n-8 | Oxide film formation→Corona (−) | 40.6 | 40.6 | 40.6 | 40.5 | 40.5 | 40.6 | 0.07 |

[1]Coefficient of variation

From the results shown in Table 1, it was confirmed that, as to both of the p-type silicon wafer and the n type silicon wafer, the PL intensity was enhanced and variation in repeated measurement results along with a lapse of time (temporal change) was reduced (the coefficient of variation CV was lowered) by conducting formation of an oxide film and a corona discharge treatment, as the pretreatment in the PL measurement.

Furthermore, from the results shown in Table 1, it was also confirmed that, as to both of the p-type silicon wafer and the n-type silicon wafer, the PL intensity was enhanced and variation in measurement results along with a lapse of time (temporal change) was reduced when the oxide film surface was positively charged by corona discharge as compared with a case where the surface was negatively charged.

Example 1, Comparative Example 1 (Application to Evaluation of Metal Contamination)

Two n-type silicon wafers having a diameter of 200 mm, the surface of which was contaminated with tungsten W of known concentration, were prepared respectively for respective contamination levels.

As to the silicon wafers of respective contamination levels, one of the silicon wafers was subjected to the above-described "oxide film formation→corona (+)" and the other silicon wafer was subjected to the above-described HF treatment, as a pretreatment in the PL measurement, and then, the PL intensity was obtained by the above-described method.

Figure 2:
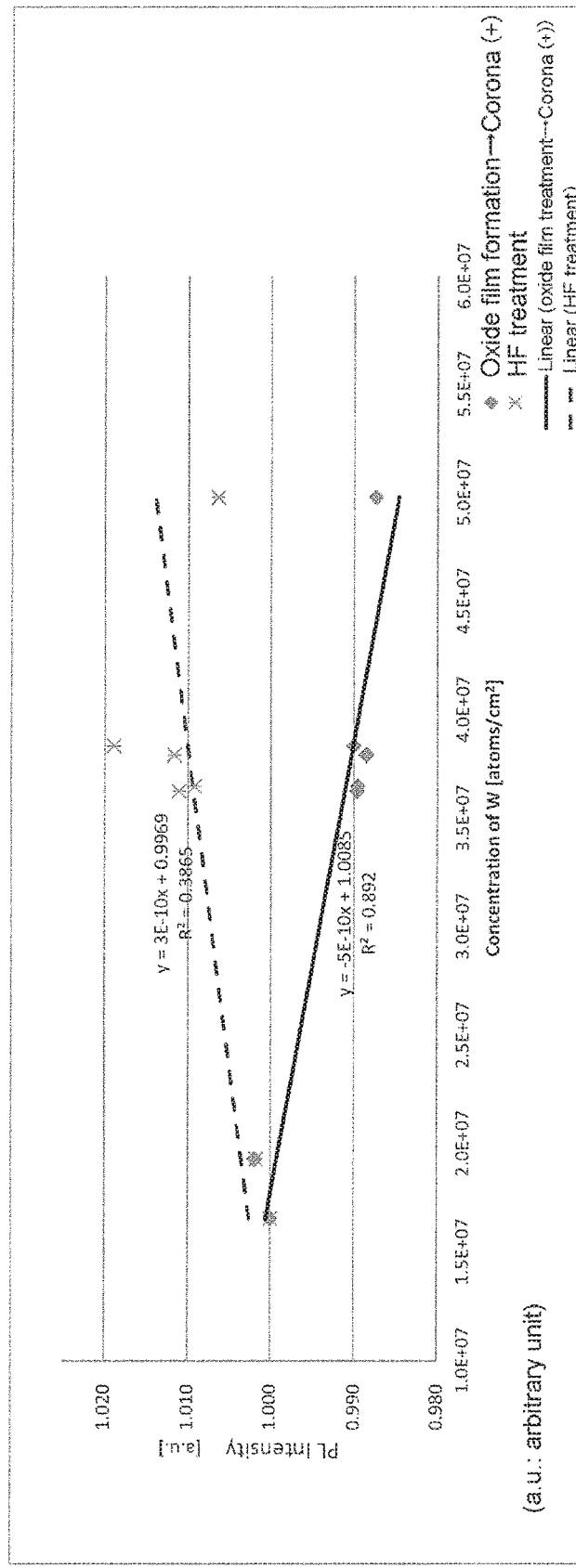
FIG. 2 is a graph showing the correlation between PL intensity and concentration of metal contamination obtained in Example 1 and Comparative Example 1.

The graph shown in FIG. 2 is a graph with a known metal contamination concentration (tungsten concentration) as the horizontal axis and PL intensity as the vertical axis. Fitting performed for the graph shown in FIG. 2 by a least-square method gave the straight line shown in FIG. 2, which mean that the closer square $R^2$ of the correlation coefficient is to 1, the stronger correlation there is between the tungsten quantity and the obtained PL intensity.

As shown in FIG. 2, as the result of performing the oxide film formation and corona discharge treatment as the pretreatment in the PL measurement, the PL intensity was higher and the correlation coefficient $R^2$ was closer to 1 for either contamination level than in a case where the HF treatment was performed.

From the above results, it can be confirmed that high sensitivity measurement of metal contamination is possible by the evaluation method according to an aspect of the present invention. Furthermore, according to the evaluation method of the present invention, variation in measurement results along with a lapse of time (temporal change) can be small and evaluation with high accuracy is also possible, as shown in Table 1.

The present invention is useful in a field of manufacturing a semiconductor substrate.

The invention claimed is:

1. A method of evaluating a semiconductor substrate, which evaluates quality of the semiconductor substrate by a photoluminescence measurement,
    wherein the photoluminescence measurement comprises,
        after subjecting a surface of an evaluation-target semiconductor substrate to a pretreatment,
        irradiating the surface with excitation light, and then
        detecting emission obtained from the surface having been irradiated with the excitation light;
    wherein the pretreatment comprises subjecting the surface of the evaluation-target semiconductor substrate to be irradiated with the excitation light to an oxide film formation treatment and charging the surface of the formed oxide film by corona discharge, and
    wherein
        the evaluation is carried out with an index in the form of an average value of emission intensities of the emission detected at various portions within the surface having been irradiated with the excitation light, or
        the evaluation is carried out based on an in-plane distribution information of emission intensities of the emission detected at various portions within the surface having been irradiated with the excitation light.

2. The method of evaluating a semiconductor substrate according to claim 1, wherein the semiconductor substrate is a p-type semiconductor substrate.

3. The method of evaluating a semiconductor substrate according to claim 1, wherein the semiconductor substrate is an n-type semiconductor substrate.

4. The method of evaluating a semiconductor substrate according to claim 1, wherein the surface of the oxide film is positively charged by the corona discharge.

5. The method of evaluating a semiconductor substrate according to claim 1, wherein the quality to be evaluated is metal contamination of the semiconductor substrate.

6. The method of evaluating a semiconductor substrate according to claim 1, wherein the oxide film formation treatment is performed by dry oxidization.

7. The method of evaluating a semiconductor substrate according to claim 6, wherein the oxide film formation treatment is performed by thermal oxidization.

8. The method of evaluating a semiconductor substrate according to claim 1, wherein the semiconductor substrate is a silicon substrate.

9. A method of manufacturing a semiconductor substrate, which comprises:
    preparing a semiconductor substrate lot including a plurality of semiconductor substrates;

extracting at least one semiconductor substrate from the lot;

evaluating the extracted semiconductor substrate; and shipping, as a product substrate, at least one semiconductor substrate included in the same lot as the lot in which the semiconductor substrate having been determined to be a non-defective product by the evaluation is included, wherein the evaluation of the extracted semiconductor substrate is performed by the method according to claim 1.

10. The method of evaluating a semiconductor substrate according to claim 1, wherein the emission intensity of the detected emission is a band edge emission intensity of silicon.

* * * * *